(12) United States Patent
Harpe

(10) Patent No.: US 8,134,487 B2
(45) Date of Patent: Mar. 13, 2012

(54) ASYNCHRONOUS SAR ADC

(75) Inventor: Pieter Harpe, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 3 days.

(21) Appl. No.: 12/878,677

(22) Filed: Sep. 9, 2010

(65) Prior Publication Data

US 2011/0057823 A1 Mar. 10, 2011

Related U.S. Application Data

(60) Provisional application No. 61/241,224, filed on Sep. 10, 2009, provisional application No. 61/300,676, filed on Feb. 2, 2010.

(30) Foreign Application Priority Data

Feb. 1, 2010 (EP) .................................. 10152283

(51) Int. Cl.
*H03M 1/34* (2006.01)
(52) U.S. Cl. ........................ 341/163; 341/155
(58) Field of Classification Search .................. 341/163, 341/155, 118, 120, 122, 123, 124, 125, 156, 341/157, 166, 167, 168, 169, 170; 375/24; 324/309; 702/76

See application file for complete search history.

(56) References Cited

U.S. PATENT DOCUMENTS 5,260,705 A * 11/1993 Inukai ........................... 341/155

OTHER PUBLICATIONS

Kinniment, D.J. et al., "Towards Asynchronous A-D Conversion", Advanced Research in Asynchronous Circuits and Systems, 1998 Fourth International Symposium on San Deigo, California, May 30-Apr. 2, 1998, pp. 206-215.
European Search Report, European Patent Application No. EP 10152283 dated Sep. 16, 2010.

* cited by examiner

*Primary Examiner* — Joseph Lauture
(74) *Attorney, Agent, or Firm* — McDonell Boehnen Hulbert & Berghoff LLP

(57) ABSTRACT

An asynchronous analog to digital convertor for converting an analog input signal into a digital output is presented. According to an embodiment, the analog to digital convertor comprises a clock input operable to receive an external clock signal having a clock period, a comparator operable to compare the analog input signal to a reference signal, a digital to analog converter operable to generate the reference signal corresponding to a state of a successive approximation register, and a control block connected to the comparator and to the digital to analog converter. The control block is operable to generate and receive a sequence of control signals according to a successive approximation algorithm, to perform a plurality of comparisons, and to update the state of the successive approximation register thereby generating the digital output.

20 Claims, 14 Drawing Sheets

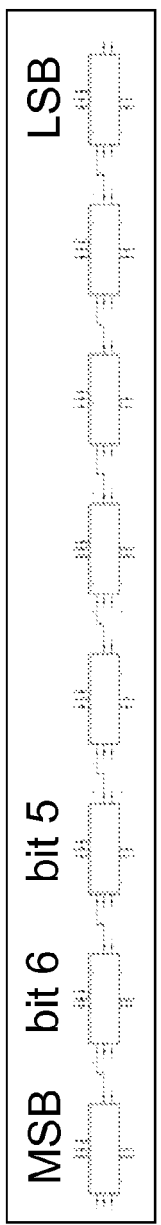
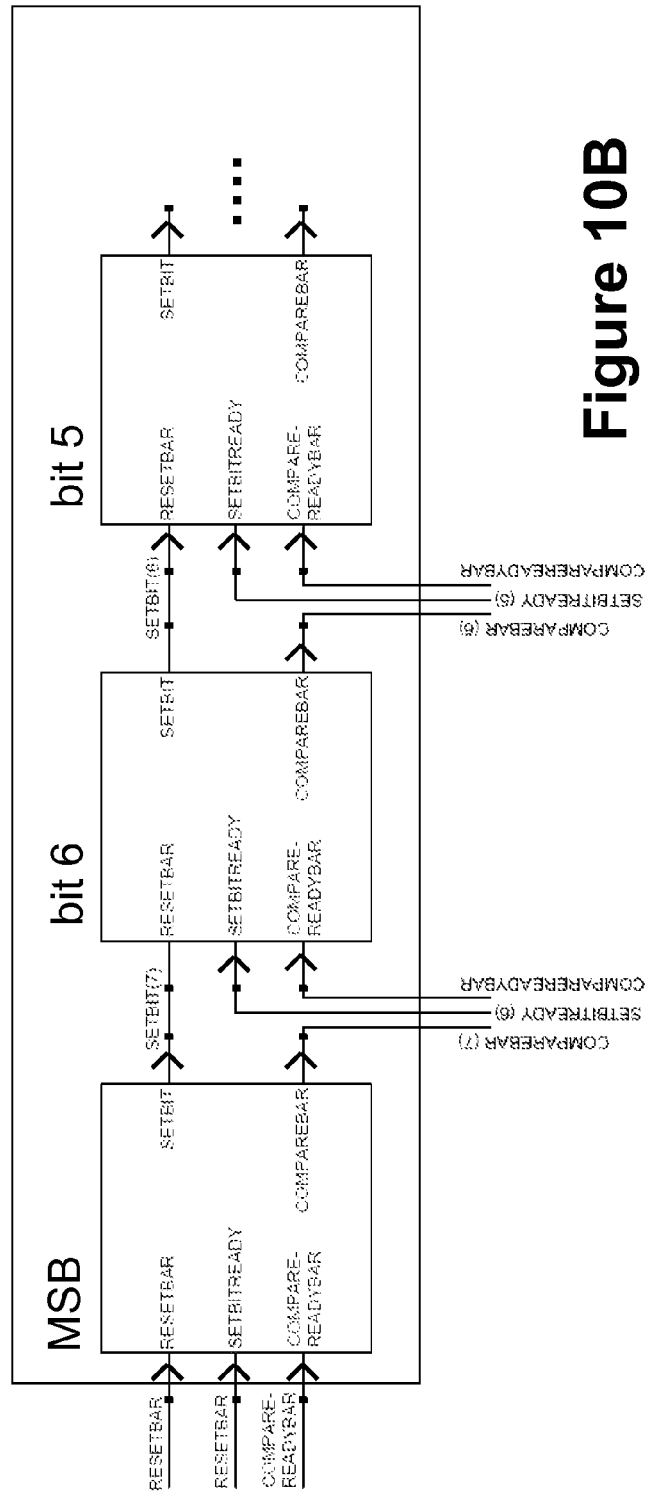
Figure 10A
Figure 10B

ASYNCHRONOUS SAR ADC

CROSS-REFERENCE TO RELATED APPLICATIONS

This application claims priority to U.S. Provisional Application Ser. No. 61/241,224 filed Sep. 10, 2009, European Patent Application No. 10152283 filed Feb. 1, 2010, and U.S. Provisional Application Ser. No. 61/300,676 filed Feb. 2, 2010. The contents of U.S. Provisional Application Ser. No. 61/241,224, European Patent Application No. 10152283, and U.S. Provisional Application Ser. No. 61/300,676 are incorporated by reference herein in their entirety.

TECHNICAL FIELD OF THE INVENTION

This invention relates generally to analog-to-digital converters, in particular to asynchronous successive approximation analog to digital convertors.

The invention also relates to an electronic device comprising such an analog to digital convertor.

BACKGROUND OF THE INVENTION

An analog-to-digital converter (ADC) is a common building block of modern integrated circuits. It is commonly used to sample an analog signal and convert it into digital values, which can, for example, be used for further digital processing. Different architectures are in use today to meet a wide range of requirements, such as linearity, conversion speed, noise, or power consumption. Examples of ADC architectures include flash ADC, linear approximation ADC, successive approximation ADC (SAR), sigma delta ADC, and others.

Successive approximation ADC is the name commonly given to an analog-to-digital conversion process in which digital approximations of the input analog voltage are determined on the basis of a binary search. A digital value stored in an n-bit successive approximation register (SAR) is input to a digital-to-analog converter, and a decision is made as to whether the value in the SAR represents an analog voltage that is higher or lower than the input analog value. The initial value of the SAR is conventionally set to one-half the number that can be represented in the n bits of the SAR. To be more precise, an n-bit register can contain a value of $2^n-1$, but for purposes of successive approximation, the initial value has the most significant bit set and the others cleared, which translates into a value of $2^n/2$. If this comparison reveals that the digital approximation is indeed lower than the input voltage, the bit that was initially set remains set, the bit of next lower significance is also set, and another trial commences. If on the other hand, the SAR value is greater than the input analog voltage, the bit that was set for that trial is cleared, the bit of next lower significance is set, and another trial commences. It can be appreciated from this example why a successive approximation approach bears such a similarity to a binary search procedure. Each bit of the SAR is set or cleared based upon a trial, so the analog to digital conversion process requires only "n" trials to reach completion. A conventional SAR converter consists of only a DAC (digital-to-analog converter), a SAR register, control logic, and a single comparator. To generate an n-bit conversion result, each component of the converter is used (or updated) n times in a series of what are known as bit trials.

One of the most common implementations of the successive approximation ADC, the charge-redistribution successive approximation ADC, uses a charge scaling DAC. The charge scaling DAC simply consists of an array of individually switched binary-weighted capacitors. The amount of charge upon each capacitor in the array is used to perform the aforementioned binary search in conjunction with a comparator internal to the DAC and the successive approximation register.

A disadvantage of traditional SAR ADC's is that a large number of clock cycles are necessary to implement a single n-bit conversion, resulting in a complicated state-machine running at a highly oversampled clock dissipating a lot of power.

SUMMARY OF THE INVENTION

An asynchronous analog-to-digital converter (ADC) for converting an analog voltage signal into a digital output is presented. In some embodiments, the ADC may comprise a clock input for receiving an external clock signal having a clock period, and a comparator arranged for comparing the analog voltage signal to a reference voltage. The ADC may additionally comprise a digital-to-analog converter (DAC) for generating the reference voltage corresponding to a state of a successive approximation register (SAR) as well as a control block connected to the comparator and to the DAC. The control block may serve to generate and to receive a sequence of control signals according to a successive approximation algorithm, to perform a plurality of comparisons, and to update the state of the successive approximation in order to generate the digital output (that is, the state of the successive approximation register).

In some embodiments, the control block may comprise a plurality of identical bit-slices connected in a chain. The chain may comprise a most significant bit-slice (MSB-slice) and a least significant bit-slice (LSB-slice) that are interconnected by a plurality of intermediate bit-slices arranged for being activated one after the other. The MSB-slice may be arranged to be activated by the external clock signal, while the LSB-slice and the intermediate bit-slices may be arranged to be activated by a previous bit-slice. That is, the LSB-slice and the intermediate bit-slices may be activated one after another.

In some embodiments, each bit-slice may comprise a state machine for controlling the comparator. The comparator may thus be operable to compare the analog voltage signal to the reference voltage and store the result of the comparison as a bit value in the successive approximation register. Each bit-slice (except the LSB-slice) may be arranged for setting the next bit of the successive approximation register and for activating the next bit-slice.

In some embodiments, each bit-slice may comprise dynamic logic with parasitic capacitors for storing each state of the state machine. The dynamic logic may be controlled by asynchronous signals.

In an embodiment, the asynchronous analog to digital converter further comprises a sample and hold block arranged for sampling the analog voltage signal and for storing it as a sampled voltage.

By using dynamic logic controlled by asynchronous signals (as opposed to using standard clocked dynamic logic, such as domino logic or NORA logic using a common clock signal), power losses due to charging and discharging capacitance of the clock-lines and charging and discharging parasitic capacitances of the transistor may be avoided. In contrast to common-clock-signal logics, the logic of the present invention is only switched when actually needed, thereby saving power. In addition, asynchronous logic allows signals to be locally generated, so that on average the control lines can be kept shorter, again saving power.

By providing a structure where individual bit-slices are activated one after the other, only a small part of the complete circuit is actively consuming power. If one large state-machine were used, the entire state-machine would be actively involved for executing the algorithm. Thus power can be saved.

By providing an asynchronous chain that only needs to be initiated by an external clock signal and then runs automatically in a self-timed way, an oversampling clock and corresponding switching losses can be avoided. In addition, high speed operation is provided.

In addition, by using identical bit-slices, design effort can be reduced, and the architecture of the bit-slice optimized. Further, a flexible architecture is provided that can be easily adapted for an analog to digital convertor with a larger or smaller number of bits.

Preferably the state machine comprises a dynamic logic stage with a non-complementary pull-up network and pull-down network connected to the same nod. Both the pull-up network and the pull-down network are foreseen to be controlled only by asynchronous signals so as to enable multiple state transitions during the evaluation of the dynamic logic stage.

Providing activation means for either pulling up or down a node offers flexible asynchronous operation, as it does not need a repeating clock to pre-charge the circuit before every new evaluation of the stage. In particular it allows multiple state transitions of the same stage, as the pull-up function and pull-down function can be activated by different signals. Because of this flexibility the use of a complex control mechanism requiring a lot of logic can be avoided, therefore the number of transistors can be reduced, and also the power to operate the circuit.

Such a technique is traditionally highly discouraged because it could potentially lead to shortening the power and ground rails at moments where both the pull-up network and the pull-down network are active at the same time, for example as a result of spikes. This effect is minimized by choosing an architecture based on a plurality of identical slices.

In some embodiments, the parasitic capacitors may be pre-charged once at the beginning of the external clock period, and may asynchronously change state once or twice during the clock period.

At the beginning of the successive approximation algorithm, the most significant bit (MSB) of the successive approximation register is set to "1" while all other bits are set to "0". This happens once at the start of the clock period. Next, the value of the MSB may be changed to "0" or may remain "1", depending on the result of the comparison of the analog voltage signal to the reference voltage made. During the rest of the clock period, successively each other bit is set to "1". Each of the remaining bits may either remain set to "1" or may be changed back to "0", depending on the result of each comparison with the reference voltage. While the MSB will change state once, the other bits may change state once or twice, depending on analog voltage signal (or the sampled voltage).

In standard (clocked) dynamic logic, all capacitors are charged in one clock phase (the pre-charge phase), and then the function of the stage is evaluated in the other clock phase (the evaluation phase). During that evaluation, the value on the capacitor may remain the same, or may change, but it can change only once during a single clock period.

In some embodiments, the successive approximation register may be a dynamic register consisting of a plurality of parasitic capacitors of the state machines. By using dynamic logic, in which a capacitor is charged and then left floating while holding its value, power can be saved. Additionally, by using dynamic logic for holding the bits in the successive approximation register (instead of using flip flops), extra power can be saved during the execution of the SAR algorithm.

In some embodiments, the asynchronous ADC also comprises a regenerative register for storing the state of the dynamic register after the comparison of the LSB-slice is complete. The asynchronous ADC may also comprise a standby controller. The standby controller may serve to place the comparator, the DAC, and the control block in a standby mode after the transfer of the state of the dynamic register to the static register, and may also serve to place the same blocks in an active mode again at the beginning of the next external clock period.

By providing a standby controller, a large part of the ADC can be placed in a low power mode after the algorithm is complete. Before doing so, the value stored in the dynamic register should be copied first to a regenerative register. As an example, flip-flops may actively hold the value. Thanks to this standby controller, the static power consumption of the asynchronous ADC is minimized, so that the asynchronous ADC is also very suited for low conversion speeds. By placing the above-mentioned blocks in a low power mode automatically and directly after saving the dynamic register value, power savings are maximized. Note that this mechanism also works optimally for a wide range of clock frequencies, or even for a variable clock frequency.

In some embodiments, the state machine of each bit-slice may be partitioned as a main state machine with six transistors connected in two stages, and a DAC state machine with six transistors connected in a single stage. In the DAC state machine, each parasitic capacitor may serve as a single bit of the successive approximation register.

By partitioning the state machine in two parts, the complexity of each partial state machine can be minimized. Through clever partitioning of the functionality, the risk for spikes or glitches on the asynchronous signals can be minimized, thereby increasing robustness of the system.

BRIEF DESCRIPTION OF THE DRAWINGS

Presently, several embodiments are described below in conjunction with the appended drawings, wherein like reference numerals refer to like elements in the various drawings.

FIG. 10A illustrates resetting a chain of main control blocks.

FIG. 10B depicts interconnection of three main control blocks.

DETAILED DESCRIPTION

This invention describes the architecture of a low power asynchronous SAR (successive approximation register) ADC (analog to digital convertor). Most drawings are shown for an 8-bit ADC, but the invention is not limited thereto. A person of ordinary skill in the art may easily extend or reduce the number of bits of the ADC. The asynchronous SAR ADC proposed in this invention only needs a single external clock with a frequency equal to the sampling frequency.

Figure 1:
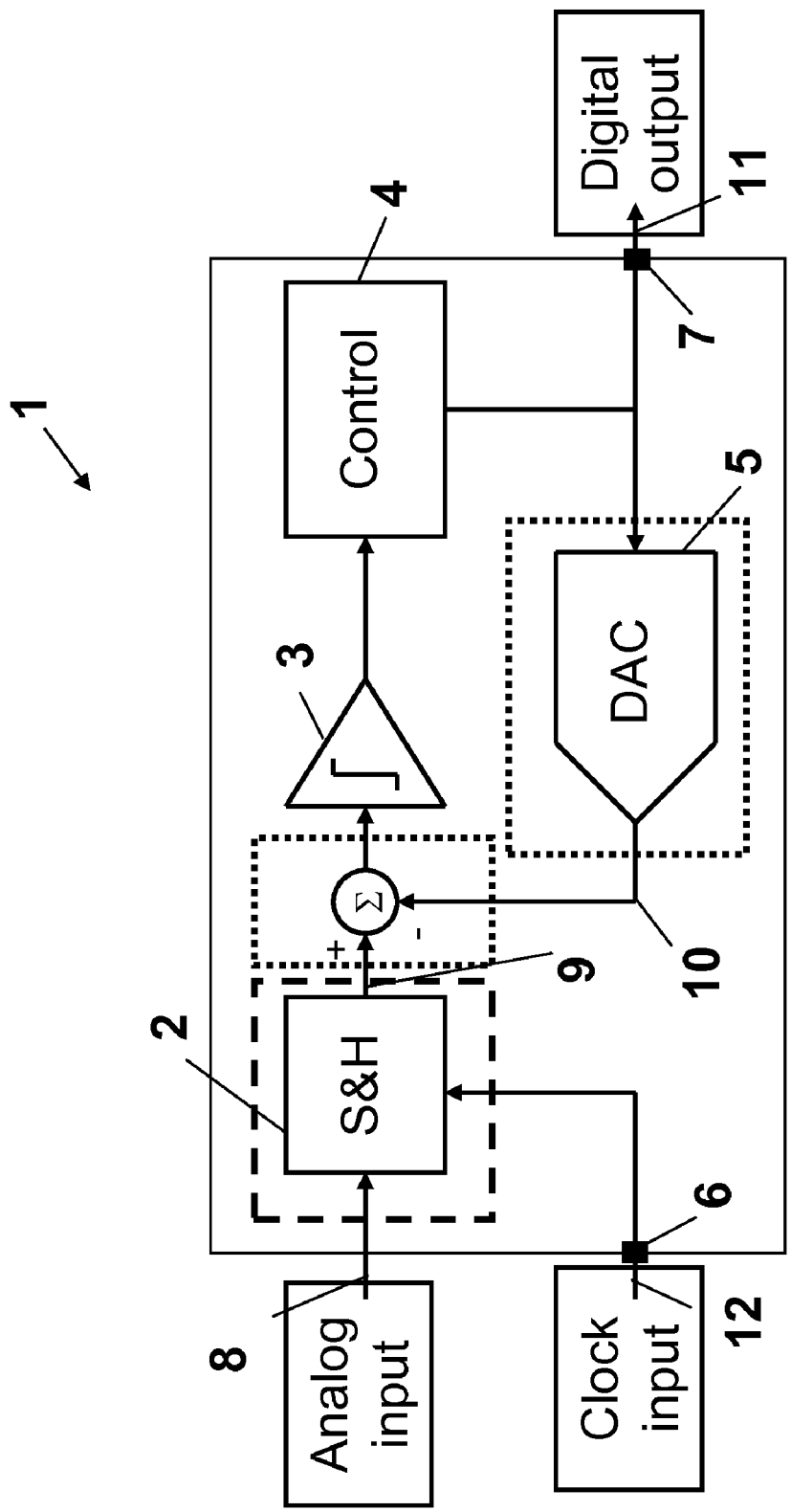
FIG. 1 depicts a block diagram of a prior art SAR ADC.

FIG. 1 depicts a block diagram of a prior art SAR ADC. The SAR ADC 1 is an n-bit ADC comprising a sample and hold (S&H) block 2, a comparator 3, a control block 4, an n-bit DAC 5, a first input/output (I/O) 6, and a second input/output 7.

The SAR ADC 1 is shown receiving an analog input (AIN) 8 into the S&H block 2. The AIN 8 may be stored in the S&H block 2 as a stored value 9. The stored value 9 may then be compared to the output 10 of the n-bit DAC 5. Based on the output of the comparison, the control block 4 may tune a digital input-code of the DAC 5 such that the DAC 5 may approximate the AIN 8.

In order to make the approximation, a binary search algorithm may be employed, such that n cycles of the algorithm are required to set the n bits of the DAC 5 correctly. As the DAC 5 output 10 approximates the stored value 9, the digital code of the DAC 5 yields a digital representation of the AIN 8.

The blocks of the SAR ADC 1 may be implemented in several ways. The focus of the invention is on the control block 4, but in order to reach a low power ADC 1 that is preferably also fast, all blocks should be low power and fast. In some embodiments, the DAC 5 may be implemented as a switched-capacitor charge-redistribution DAC. Other low power components may be used as well.

Figure 2:
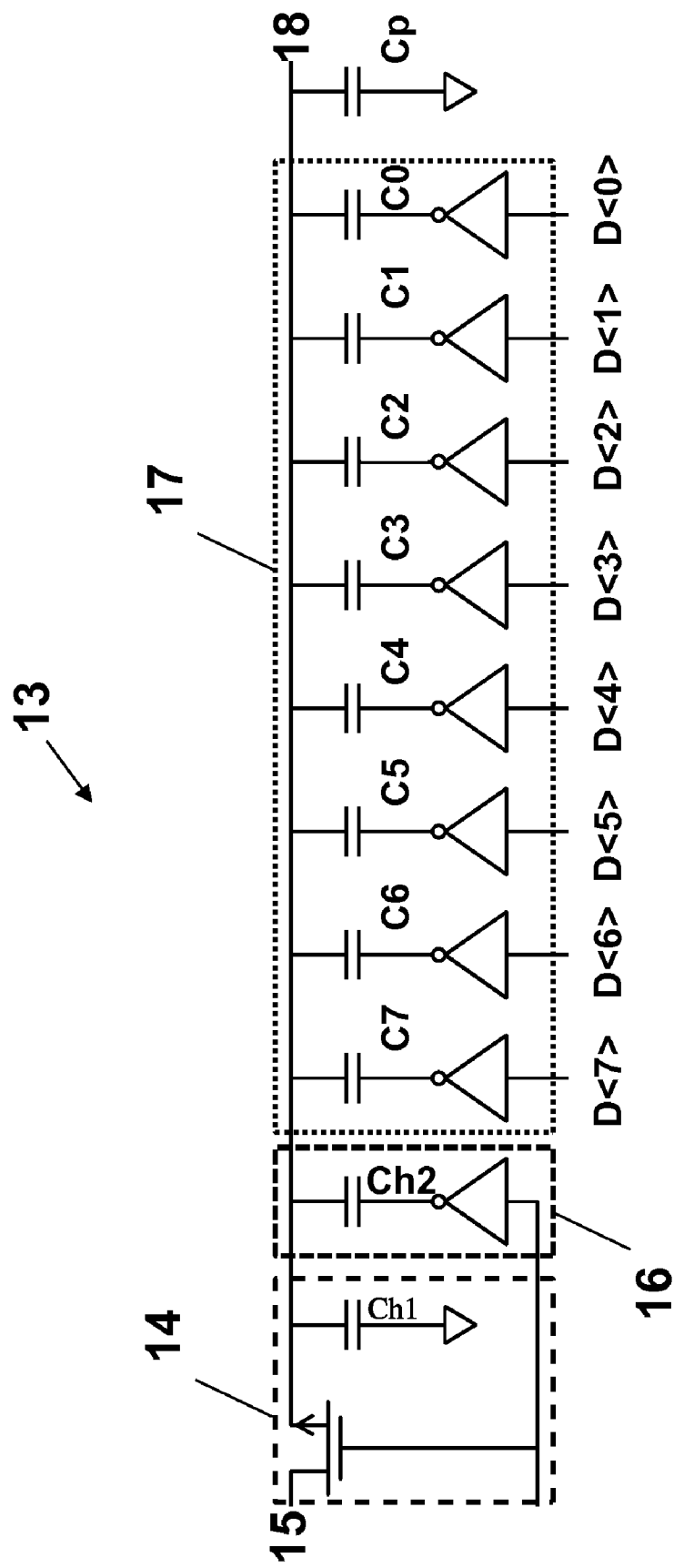
FIG. 2 depicts a prior art switched capacitor array as typically used in a charge redistribution DAC.

FIG. 2 depicts a prior art switched capacitor array as typically used in a charge redistribution DAC. The switched capacitor array 13 is shown comprising an S&H block 14 for tracking and holding an AIN 15, a common-mode level shift 16, and a DAC 17 based on a switched capacitor array. These components and their functionality are known in the art.

As shown, the S&H block 14 can be realized by means of a capacitor and a switch, here implemented by an NMOS transistor and a capacitor array. The total capacitance $C_S = C_{h1} + C_{h2} + C_{dac} + C_p$, where $C_{dac}$ is the sum of $C_0$ up to $C_7$. While the switch is closed, the value on the capacitor tracks the AIN 15. When the switch is opened, the analog output (AOUT) 18 provides a discrete-time representation of the continuous-time AIN 15.

Because of the low-voltage operation of the ADC, a proper selection of the common-mode level of the AIN 15 is required to increase the speed of operation. Especially the performance of the S&H block 14 and the comparator (not shown) are dependent on the common-mode level. The common-mode shift 16 has been implemented with an inverter and a capacitor Ch2. After the sampling clock (SCLK) goes low to sample the AIN 15, the inverter-output driving the bottom plate of Ch2 will go high. This level transition causes a common-mode shift of $V_{DD} \cdot Ch2/Cs$. This technique is known in the art.

The switched capacitor array 13 is shown further comprising a charge-redistribution DAC 17. The DAC 17 receives an 8-bit digital input code D<7:0> from a successive approximation register present in a control block (not shown). The 8-bit digital input code drives the binary-scaled capacitor array $C_0$-$C_7$ by means of buffers. The buffers are implemented by inverters, switching the bottom capacitor plates between ground (GND) and the supply voltage ($V_{DD}$). The capacitors are binary weighted. Note that the DAC is driven by the inverted digital input code, labeled D<7:0>.

Figure 3:
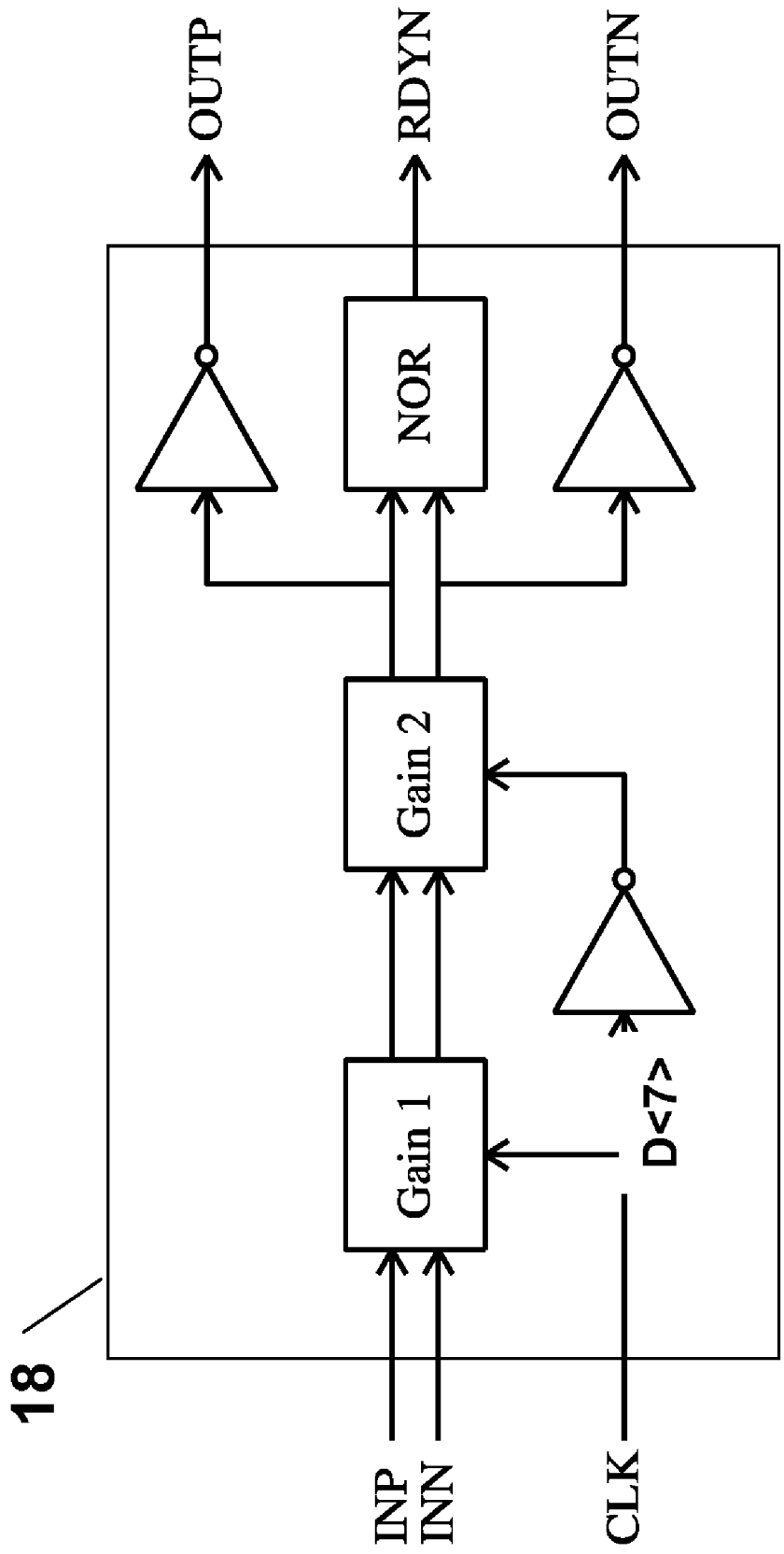
FIG. 3 depicts a simplified view of a prior art comparator.

FIG. 3 depicts a simplified view of a prior art comparator. A person of ordinary skill in the art will understand that any comparator may be used to implement the SAR DAC. In some embodiments, a comparator with low leakage and high speed may be preferred. High speed is achieved by the biasing conditions and asynchronous control logic that advances immediately after completing the comparison. For this purpose a ready-signal (RDYN) may be added to indicate completion of the comparison. The trip-point of the NOR gate may also be adjusted to make sure that the output is valid before the ready-signal (RDYN) goes low.

For the comparator 18, on the rising edge of the CLK input, (which is an asynchronous signal in the SAR ADC of the present invention), the differential signal input (INP-INN) is processed by two gain stages. The first gain stage provides some pre-gain and shielding of the input from the second stage, which is a regenerative latch. Two (digital) inverters are used to buffer the digital output. Before the actual comparison, both outputs (OUTP, OUTN) will provide a logical high level. As soon as the second gain stage latches, one of the two outputs will go low, dependent on the decision of the comparator. The output RDYN indicates when the comparison is ready and the output is valid. Before and during conversion, RDYN provides a logical '1'. As soon as a decision is made, RDYN goes low. This ready-flag (RDYN) is used by the asynchronous state-machine (specifically, the control block) to proceed to the next phase of the conversion process. The complete comparator 18 is based on dynamic circuitry, requiring no static bias current.

Figure 4:
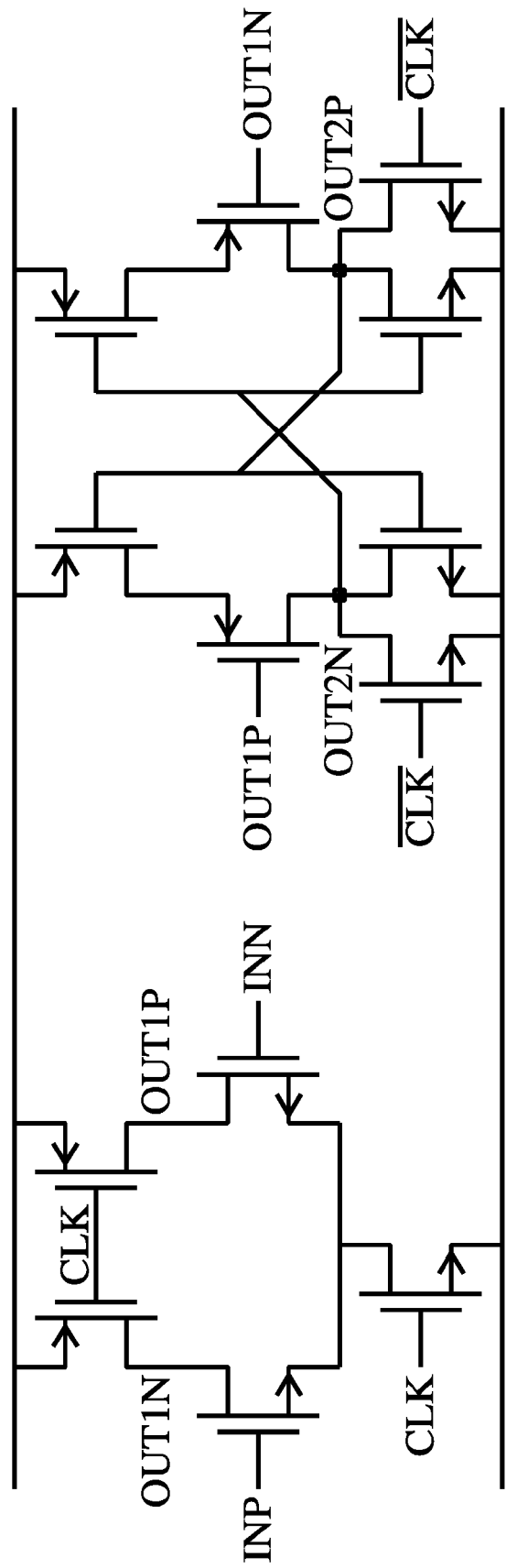
FIG. 4 depicts gain stages of the comparator depicted in FIG. 3.

FIG. 4 depicts gain stages of the comparator depicted in FIG. 3. The first stage is a differential pair of which the tail current is turned on when the CLK goes high. The output load is purely capacitive, as the PMOS transistors are turned off when the tail current is turned on. In the reset phase (when the CLK is low), the PMOS transistors precharge the output nodes of the first stage to $V_{DD}$. When the CLK goes high, the differential pair is enabled and starts to discharge the parasitic capacitance of the output nodes, reducing the voltage level at the output nodes. When a differential input signal is applied, one of the two output nodes will change faster than the other.

The second stage contains two inverters in a feedback structure. While the CLK is low, the output nodes are precharged to 0 (OUT2P=0 and OUT2N=0). When the CLK goes up, the inverters remain in the same state until one of the inputs (OUT1P or OUT1N) becomes sufficiently low to enable charging of the output capacitance. Because of the regenerative properties, the output stage will settle in one of two possible states (OUT2P=1 and OUT2N=0) or (OUT2P=0 and OUT2N=1), dependent on the applied differential input voltage. Before and during the conversion, both outputs remain low, while one of them becomes high only after the decision has been made. Therefore a ready-flag can be generated simply by connecting a NOR gate to the output nodes (as shown in FIG. 3). In particular, the (inverted) ready-flag RDYN is normally high, and switches to low as soon as the conversion is complete. The trip-point (the voltage level at the input at which the NOR gate switches) may be chosen somewhat above the normal value to be sure that the ready signal is not generated too early.

The control block of the SAR ADC has been mentioned several times above. The purpose of the control block is to synchronize all operations in the ADC. As the ADC works asynchronously, there is no clock to which all operations can be synchronized. Instead, the operations are synchronized by generating start and ready flags between the blocks to indicate whenever an operation is allowed to start and whenever an operation is finished.

Figure 5:
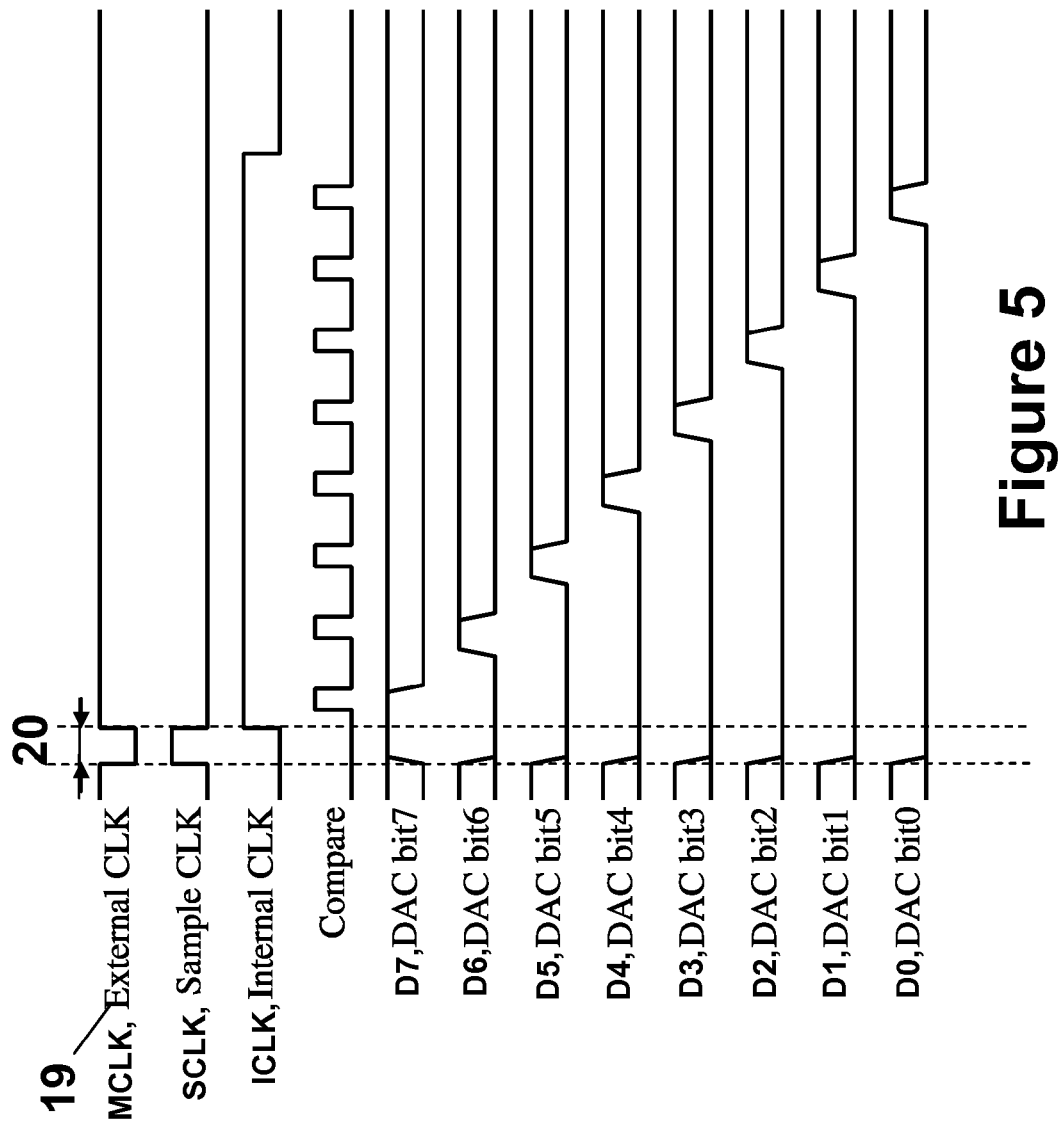
FIG. 5 depicts a general timing diagram of an SAR ADC, according to the present invention.

FIG. 5 depicts a general timing diagram of an SAR ADC, according to the present invention. In particular, FIG. 5 shows a high level overview of the operations of the ADC in the time domain. A single external clock 19 is used to generate two clock signals internally: the sample clock, used to control the S&H circuit, and the internal clock ICLK, used to start the analog to digital conversion.

While the external clock 19 is low, a sampler is tracking the analog input voltage (AIN). As soon as the external clock 19 goes high, the AIN is held on the sampling capacitor and the analog to digital conversion can start. One by one, starting with the MSB, each bit of the DAC is set to one, a comparison is performed, and based on the result of the comparison the bit of the DAC is kept at one or reset to zero. When all bits of the successive approximation register of the DAC are resolved, the conversion is complete and the internal clock ICLK will go low to enable a low-power standby mode. A new conversion for the next AIN will start at a new external clock cycle 19. Note that DAC bit 7 is set to '1' and all other DAC bits are reset to '0' during the tracking phase 20, which is required to set the DAC 5 to midscale as explained before.

Figure 6:
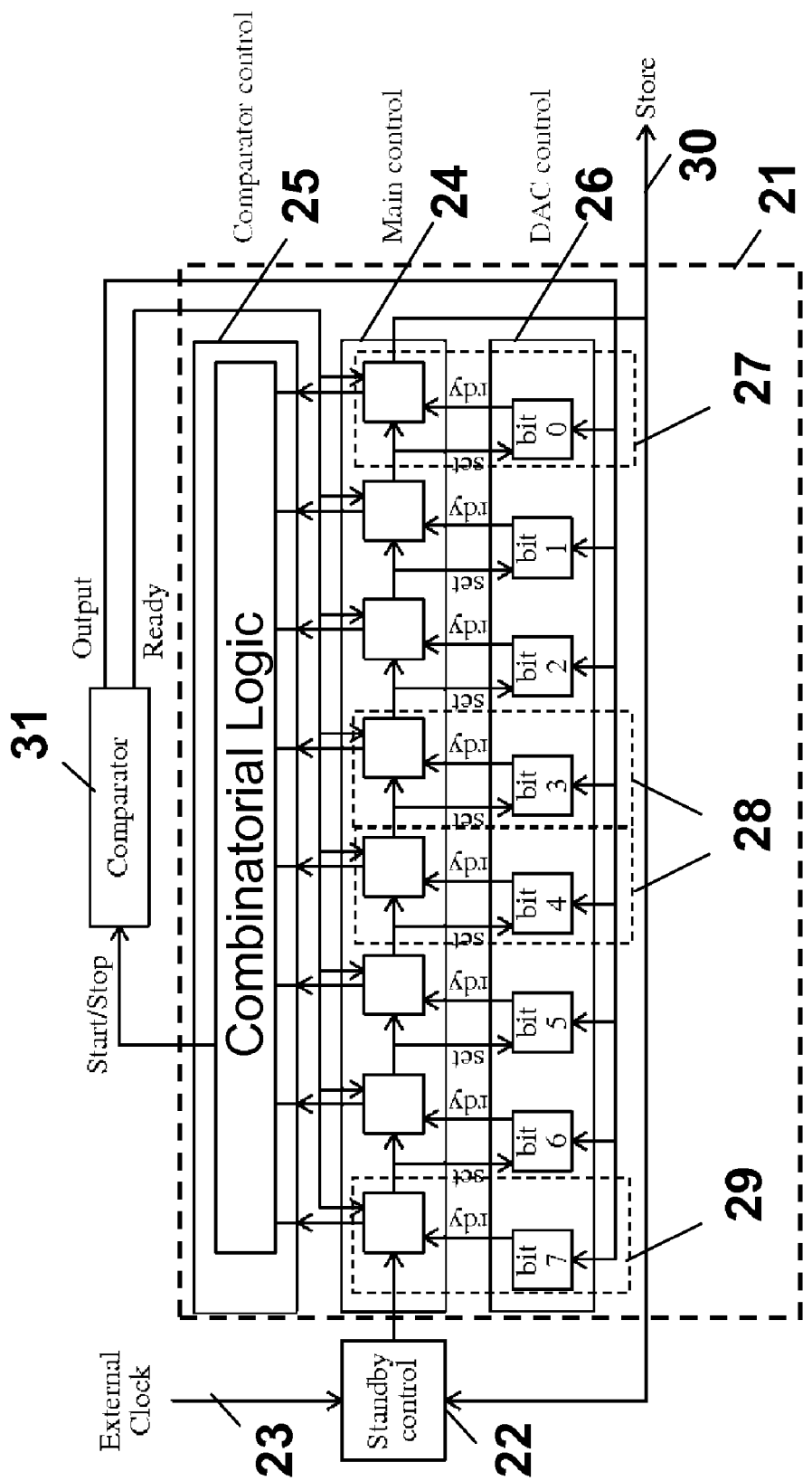
FIG. 6 depicts an embodiment of the control block of an asynchronous SAR ADC, according to the present invention.

An overview of the digital logic, realizing the algorithm of FIG. 5, is shown in FIG. 6. FIG. 6 depicts an embodiment of the control block of an asynchronous SAR ADC, according to the present invention. The control block 21 contains several sub-blocks, including:

Standby controller 22, which initiates an analog to digital conversion when a rising edge of an external clock 23 is applied. When the conversion is completed, the standby controller 22 returns the ADC to a low-power standby mode;

Main control 24, which serves as the main state machine of the SAR ADC.

The main control 24 controls the repetitive actions of setting bits in the successive approximation register, and controls comparisons of the sampled voltage and the DAC voltage;

Comparator control 25, which controls the start and stop of the comparator 31 for each bit-cycle; and DAC control 26, which controls the elements of the DAC and contains the successive approximation register with the digital output code.

Once the standby controller 22 enables the ADC, the following operations begin to iteratively take place:

(1) A bit is set in the DAC control 26, and the next slice (labeled 27, 28, 29) in the main control 24 is activated.

2) The DAC control 26 generates a ready flag for the active slice 27, 28, or 29 to indicate the bit is set.

3) The active slice 27, 28, or 29 generates a start flag for the comparator 31 control 25 to request a new comparison.

4) When the comparison is ready, a ready flag is sent back by the comparator 31 to the active slice 27, 28, or 29, and the output of the comparison is stored in the successive approximation register.

5) The active slice 27, 28, or 29 sets the next bit of the successive approximation register, and activates the next slice active slice 27, 28, or 29 in the chain.

If the active slice is 27, the next active slice may be 28. Similarly, if the active slice is 28, the next active slice may be 29.

Once the last bit is resolved, slice 0 in the DAC controller 26 generates a ready flag for the standby controller 22 to return to standby mode. The same bit is used to generate a store signal 30, which stores the produced output code in a static output register.

Figure 7:
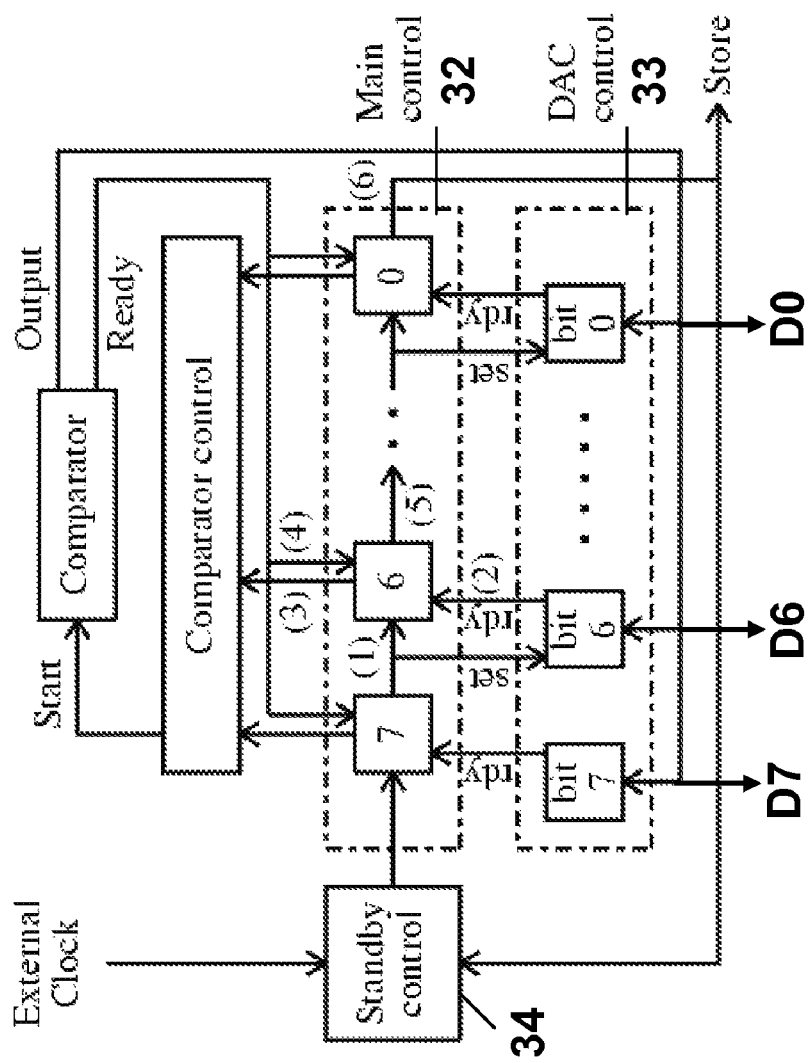
FIG. 7 depicts the control block depicted in FIG. 6, with an indication of the control signals of one bit-cycle.
Figure 8:
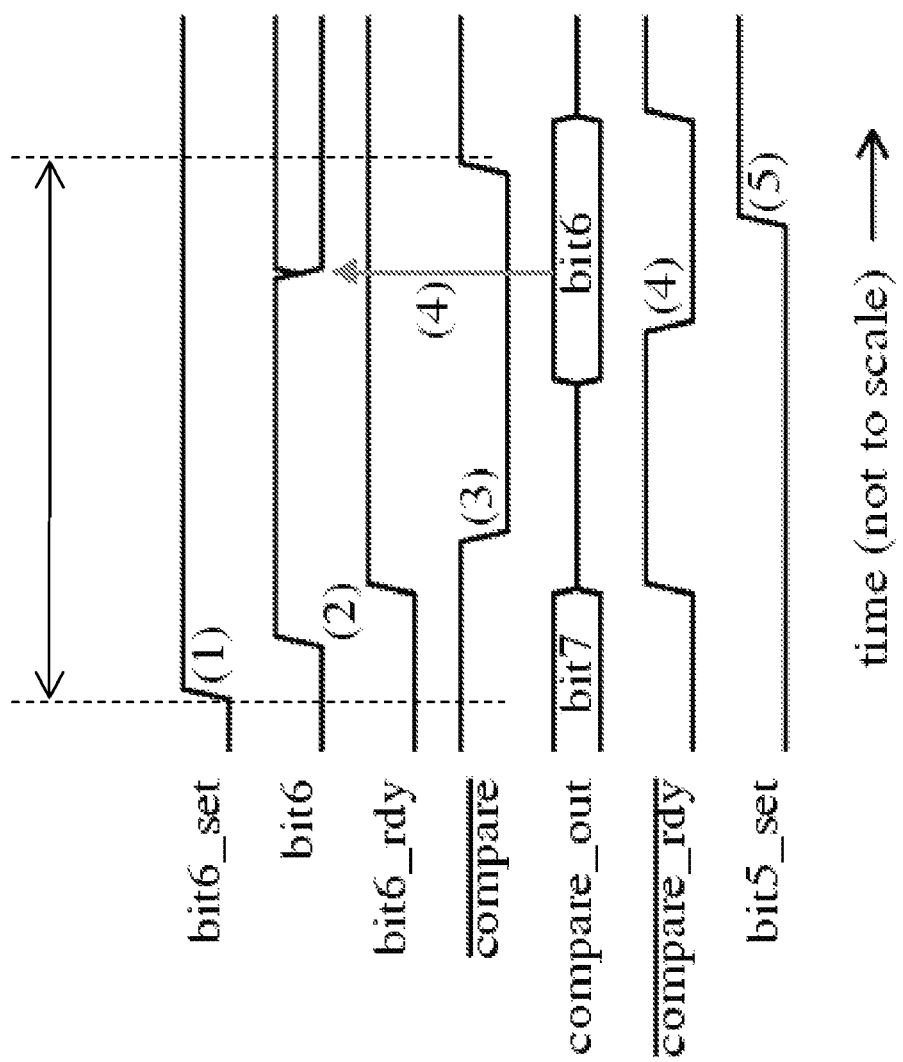
FIG. 8 is a timing diagram of one bit-cycle, corresponding to the signals depicted in FIG. 8.

FIG. 7 depicts the control block depicted in FIG. 6, with an indication of the control signals of one bit-cycle. Additionally, FIG. 8 is a timing diagram of one bit-cycle, corresponding to the signals depicted in FIG. 8. FIGS. 7 and 8 may be described together. Phases are labeled on FIGS. 7 and 8 are labeled as (x). While bit 6 is specifically considered in the Figures, a person of ordinary skill in the art will understand that the concepts may be applied to other bits as well.

In phase (1), bit 6 of the DAC is set (by bit6_set) and slice 6 of the main control 32 is initiated. When the DAC voltage is settled, a ready signal (bit6_rdy) is forwarded in phase (2). In phase (3), a comparison is requested, and in phase (4) the comparison is ready. In phase (5), the result of the comparison is stored into the DAC control 33 and the main control 32 proceeds to the next slice. In phase (6), once the SAR algorithm is finished, the digital output code is stored and a feedback-signal is sent to the standby control 34 to reset the entire logic to a predefined state in which the leakage-power is minimized.

Figure 9:
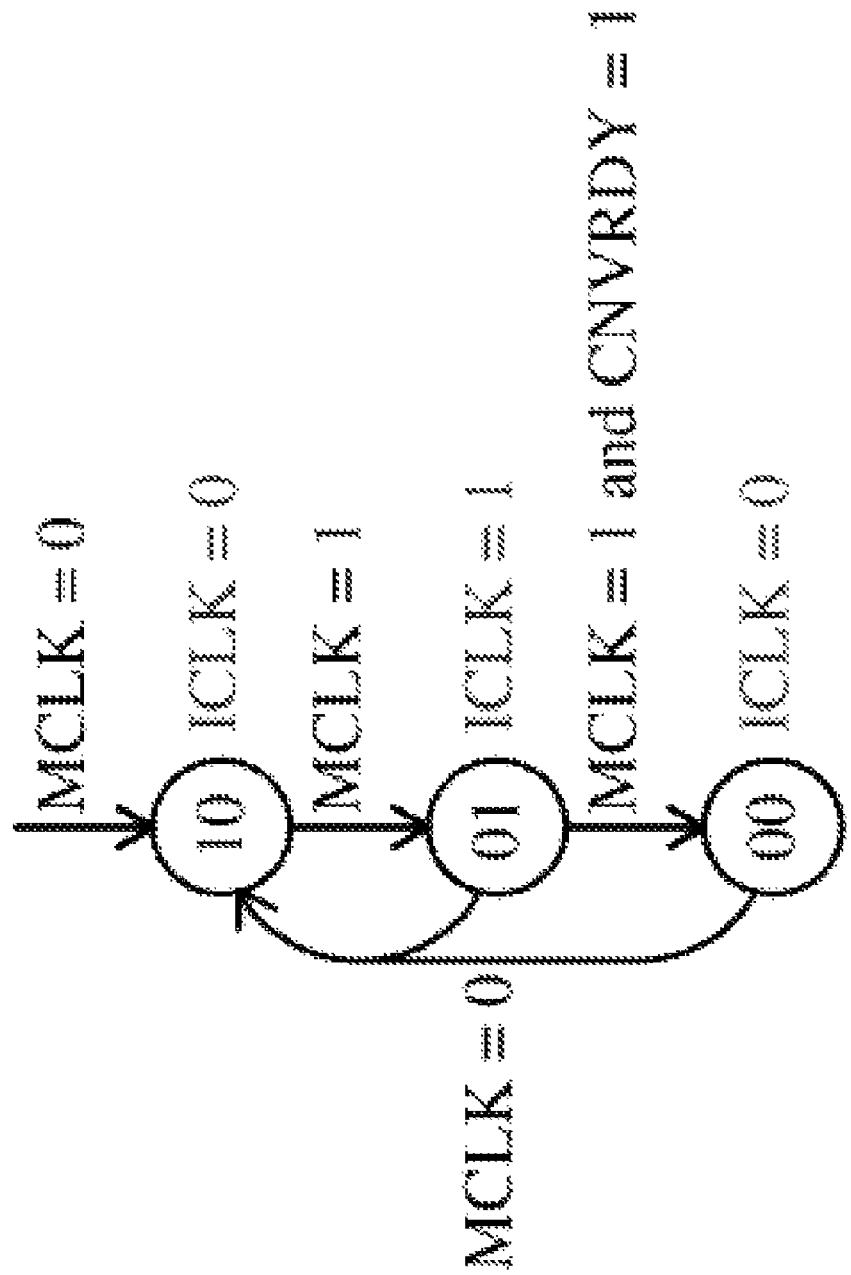
FIG. 9 depicts a state machine of the standby controller of an asynchronous SAR ADC, according to the present invention.

FIG. 9 depicts a state machine of the standby controller of an asynchronous SAR ADC, according to the present invention. According to FIG. 9, when the external clock (MCLK) =0, the state machine is reset to state 10. In state 10, the internal ADC clock ICLK is set to 0.

As soon as the external clock goes high, the state changes to 01. In state 01, the internal clock will be set to 1 to initiate an analog to digital conversion. When the analog to digital conversion is finished, the CNVRDY input signal becomes 1 and the ICLK is reset to 0. By resetting ICLK, the other control blocks will be reset to a predefined state, in which the power consumption is minimized. In order to start a new analog to digital conversion, the external clock (MCLK) has to go low (to state 10) then high again (to state 01).

The main control block implements the state machine that synchronizes the eight repetitive bit cycles 36 of the ADC. It is composed of a series of eight slices, one for each bit of the ADC. FIG. 10A illustrates resetting a chain of main control blocks. FIG. 10B depicts interconnection of three main control blocks. FIGS. 10A and 10B may be considered together.

During the standby phase, as described above in connection with FIG. 8, all slices are reset to a predefined state. As soon as the conversion phase starts, the first slice (MSB slice) will be activated and will start to determine the most significant bit (MSB, bit7) of the digital output code. When the first slice is ready, a ready-signal is forwarded to the second slice, which will start its operation to determine a bit, for example bit6 as described above. This process is repeated until the last slice (LSB slice) has resolved the last bit, namely bit0.

Figure 11:
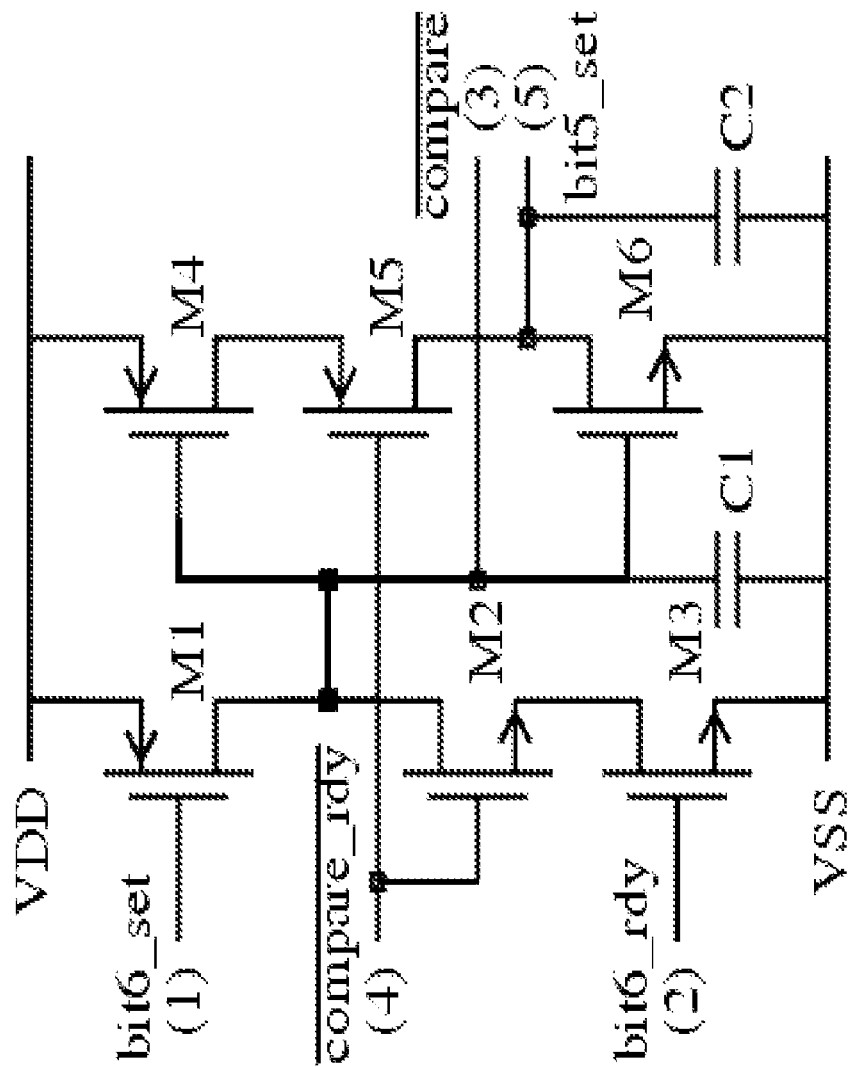
FIG. 11 depicts an embodiment of the main control slice of an asynchronous SAR ADC, according to the present invention.
Figure 12:
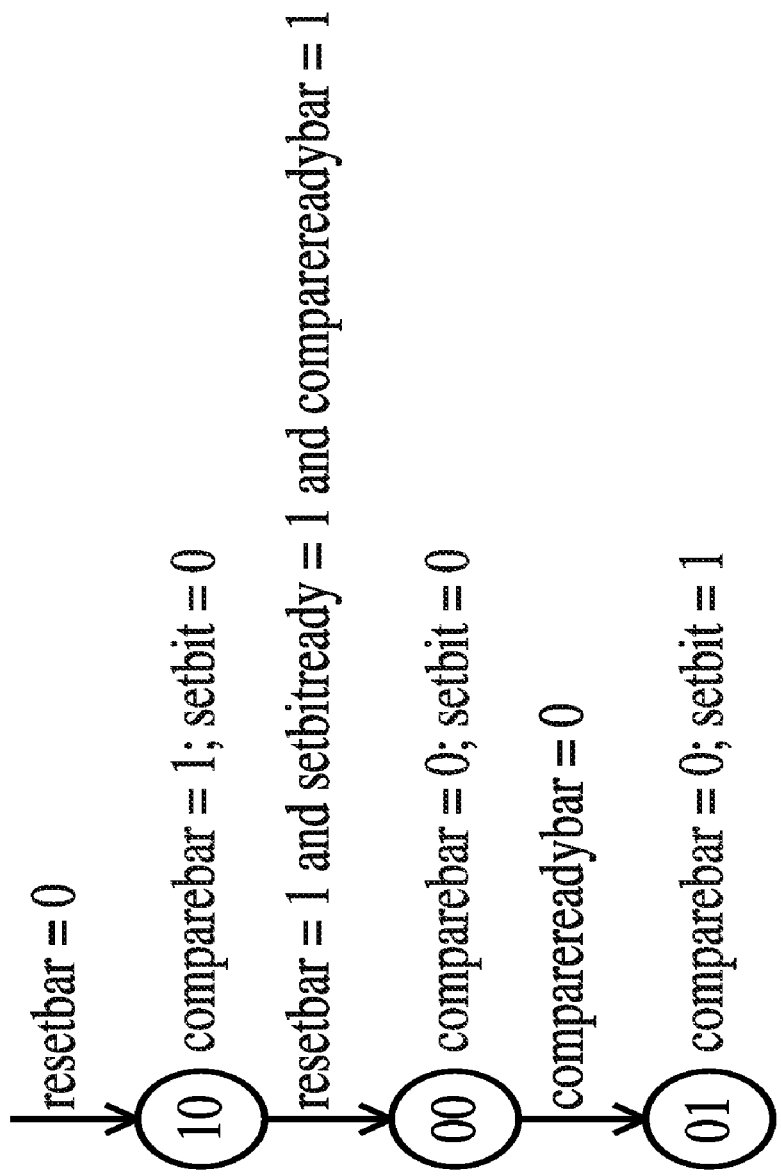
FIG. 12 depicts a state machine for the main control slice depicted in FIG. 11.

FIG. 11 depicts an embodiment of the main control slice of an asynchronous SAR ADC, according to the present invention. FIG. 12 depicts a state machine for the main control slice depicted in FIG. 11. The state machine of FIG. 12 may be considered first, and the main control slice of FIG. 11 may then be considered in order to verify the state machine of FIG. 12.

In FIG. 12, the input signals of the state machine are indicated next to the arrows, and the output signals are indicated next to the state-circles. The three states correspond to the three activities of the slice:

When resetbar=0 (during the tracking phase), the state is reset to 10, and the outputs are set to comparebar=1 and setbit=0.

When resetbar=1, setbitready=1 and comparereadybar=1, the ADC is in the conversion phase, meaning the bit of the DAC corresponding to this slice has been set and the comparator has been reset after the comparison performed in the previous slice. In this situation, the next comparison can be performed, so the state is advanced to 00, and the comparebar output is changed to 0, indicating to the comparator control 33 that a new comparison can start.

When comparereadybar=0, the comparison is ready. The state changes to 01, which is the final state of the slice. The output setbit is set to 1, which sets the next bit of the DAC to one and indicates to the next slice that it can start its operation.

The behavior of the first slice (controlling the MSB bit) is slightly different from the other bits. In this specific case, the DAC bit (MSB bit) is not reset to zero during the tracking phase, but rather is preset to one. Nonetheless, the same hardware is reused to implement this slice; the only difference is the way the input signals are connected.

Note that some signals are implemented in an active-low format, e.g. resetbar and comparereadybar while other signals are implemented in an active-high format, e.g. setbit and setbitready. By doing so, the hardware could be simplified which saves some power.

The main control slice of FIG. 11 may now be considered in order to verify the state machine of FIG. 12. To save power and high-speed operation, the design is not based on existing complementary CMOS logic, or on synchronous clocked dynamic logic such as domino logic or NORA logic, but rather on a custom design style. This significantly reduces the number of gates and the number of transitions, thereby preventing unnecessary charge and discharge operations of the parasitic capacitances.

There are two main nodes within this circuit, each having a certain parasitic capacitance, indicated by C1 and C2 in FIG. 11. These capacitances are used to store the current state of the state-machine: e.g. state 10 corresponds to a high level on C1 and a low level on C2. In relation to FIG. 12, it may be said that the two outputs of the slice (comparebar and setbit) correspond directly to the state (C1 and C2). As such, no additional output logic is required to derive the output signals from the state. We can now verify the state machine:

When resetbar is low, C1 will be charged and C2 will be discharged, resulting in state 10.

When resetbar, setbitready, and comparereadybar are high, C1 is discharged, obtaining state 00.

When the state is 00 and comparereadybar goes low, the state advances to 01.

The main control block thus performs the overall synchronization between the DAC and the comparator. In constrast, the DAC control block, as will now be described, merely controls the individual bits D7-D0. Additionally, the DAC control block contains the actual successive approximation register that stores the digital output code of the ADC.

Figure 13:
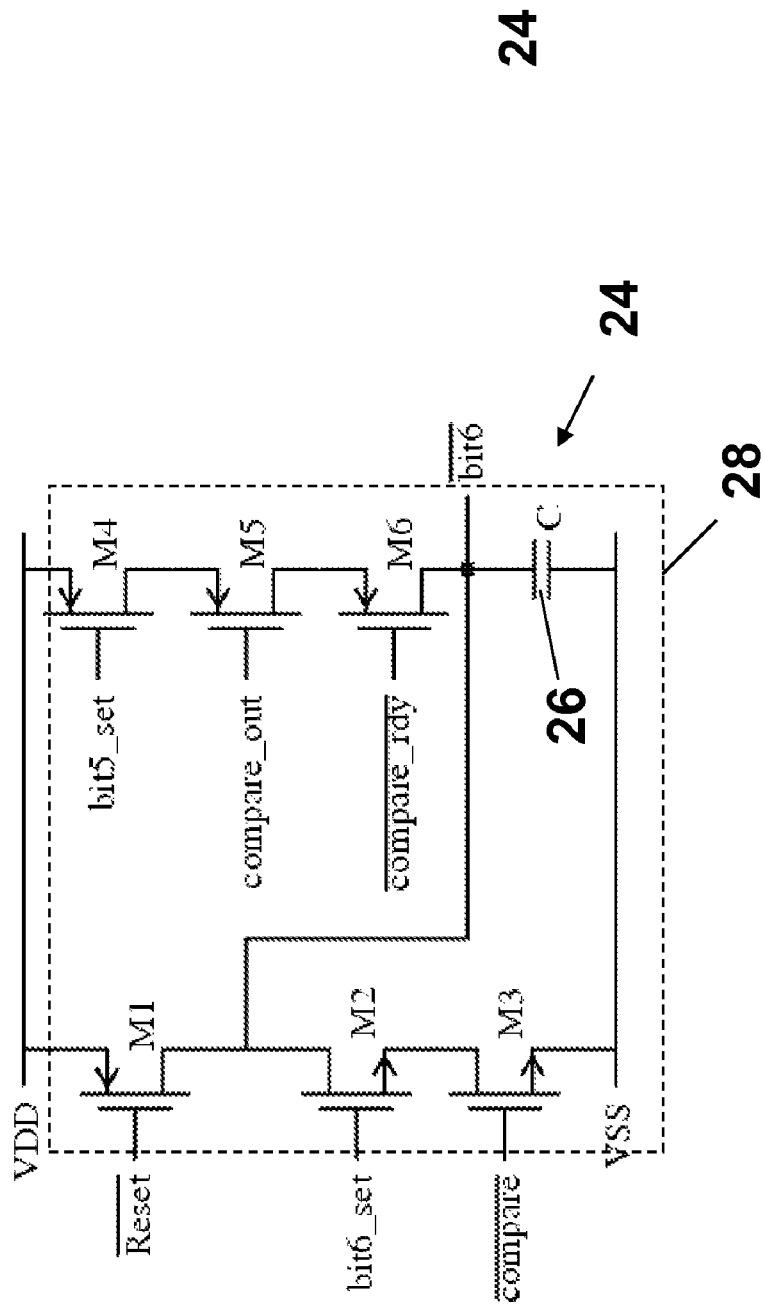
FIG. 13 depicts an embodiment of a DAC control slice of an asynchronous SAR ADC, according to the present invention.

FIG. 13 depicts an embodiment of a DAC control slice of an asynchronous SAR ADC, according to the present invention. The DAC control is composed of eight slices, and each slice controls one bit of the DAC. In the time-domain, each bit of the DAC passes through three phases (except for the MSB, which skips the first phase):

A reset phase, in which the bit is set to zero.

A set phase, in which the bit is set to one, such that the comparison can take place.

A store phase, in which the decision of the comparison is used to set the definitive output value for this bit (either zero or one).

Figure 14:
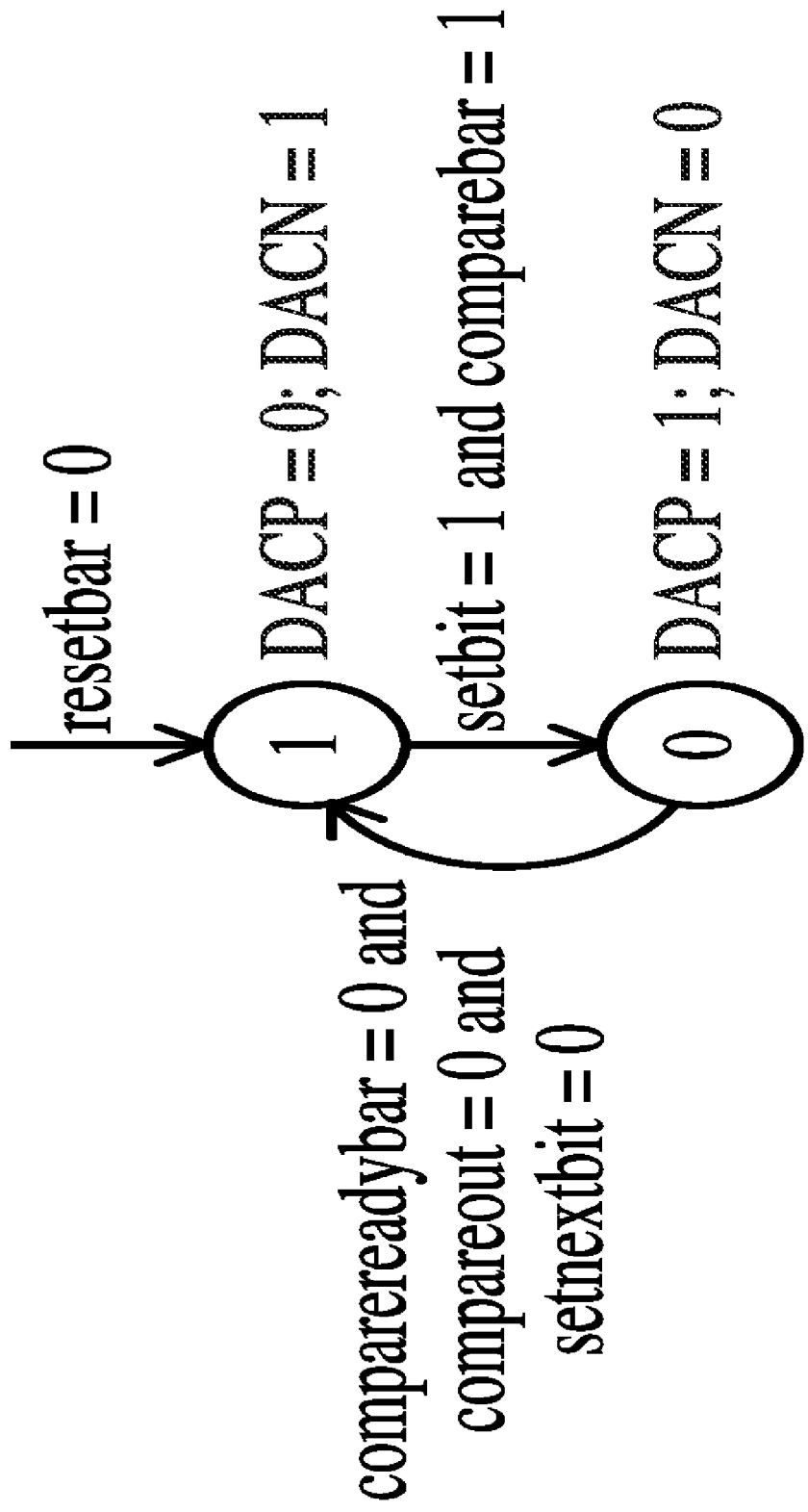
FIG. 14 depicts a state machine for the DAC control slice depicted in FIG. 13.

The three phases can be encoded by a two-state state-machine. FIG. 14 depicts a state machine for the DAC control slice depicted in FIG. 13. The state corresponds to the inverse of the value of the bit, and inherently acts as the successive approximation register 6 storing the digital output code of the DAC:

State 1, in which the bit is set to zero. This corresponds to the reset phase or the store phase when the final bit value equals zero.

State 0, in which the bit is set to one. This corresponds to the set phase, or the store phase when the final bit value equals one.

The state machine of FIG. 14 may also be described as follows:

When resetbar=0, the state is reset to 1 and the DAC bit is reset to zero.

When setbit=1 and comparebar=1, the main control block indicates that this bit should be set in order to enable the comparison. So, the state is updated to 0, setting the DAC bit to one. The DAC bit is also send back to the main control block (named setbitready), to indicate that the DAC bit has been set.

When comparereadybar=0 and compareout=0 and setnextbit=0, a comparison is ready and the obtained result equals 0, indicating that the active DAC bit should be reset to zero. As the comparator output is connected to all slices of the DAC control, it is necessary to verify which DAC bit should be reset. This is done by checking setnextbit, which is the setbit of the next DAC slice. If it is zero, it means that the current slice is the 'active' one, which should be reset. If the setnextbit=1, the result of the comparison is meant for another bit of the DAC.

Thus, the logic level on the parasitic capacitance C shown in FIG. 13 corresponds to the state. Two CMOS inverters are used as output buffers, while the remaining transistors implement the possible transitions of the state-machine according to FIG. 14.

The comparator may be controlled by a simple logic function that generates the clock for the comparator. This clock should go high whenever a slice of the main control asks for a comparison, which is indicated by a low level on the comparebar output of a slice.

Next, the comparator clock should go low as soon as possible to reset the comparator before the next comparison. However, it should not go low before the result of the comparison is processed. As the setbit output of the slice will go high upon receiving the comparereadybar signal, this is a proper indication that the result of the comparison is indeed processed. So, the comparator clock signal should be high as long as comparebar=0 and setbit=0. As each slice has its own outputs, the actual comparator clock generated by the comparator control block uses a logical combination over all slices according to the following formula:

$$\text{compare} = \sum_{\text{slices},i} \overline{\text{comparebar}_i \cdot \text{setbit}_i}$$

This function was implemented with standard CMOS gates.

During the analog to digital conversion, the generated digital output code is stored locally in the successive approximation register of the DAC control block. However, at the end of the conversion process, the ADC is reset to standby mode. At that moment, the output code would also be reset. Therefore, an additional regenerative 8-bit register is added in which the digital output code is stored just before the standby mode is activated. This regenerative 8-bit register will not be reset during standby mode, such that the digital output code remains available until a new conversion result is produced.

An output clock is also generated to simplify synchronization to the digital output data, in a traditional way. The output register is preferably implemented by a standard 8-bit flip-flop, which latches the input data at the rising edge of the store signal. The store signal is generated by the DAC controller as soon as the conversion is ready. In one embodiment, the output synchronization clock is derived from the internal clock signal ICLK, and buffered by an inverter.

I claim:

1. An asynchronous analog to digital convertor for converting an analog input signal into a digital output, the analog to digital convertor comprising:
   a clock input operable to receive an external clock signal having a clock period;
   a comparator operable to compare the analog input signal to a reference signal;
   a digital to analog converter operable to generate the reference signal corresponding to a state of a successive approximation register; and
   a control block connected to the comparator and to the digital to analog converter, wherein the control block is operable to generate and receive a sequence of control signals according to a successive approximation algorithm, to perform a plurality of comparisons, and to update the state of the successive approximation register thereby generating the digital output, wherein
      the control block comprises a plurality of identical bit-slices connected in a chain, the chain comprising a most significant bit slice (MSB-slice) and a least significant bit-slice (LSB-slice) that are interconnected by a plurality of intermediate bit-slices, wherein the bit-slices are arranged to be activated one after the other, and wherein the MSB-slice is arranged to be activated by the external clock signal, and the LSB-slice and intermediate bit-slices are arranged to be activated by a previous bit-slice;
      each bit-slice comprises a state machine arranged to control the comparator to compare the analog input signal to the reference voltage, and to store the result of the comparison as a bit value in the successive approximation register, wherein each bit-slice is arranged to set the next bit of the successive approximation register and to activate the next bit-slice; and
      each bit-slice comprises dynamic logic with parasitic capacitors arranged for storing each state of the state machine, wherein the dynamic logic is controlled by asynchronous signals.

2. The asynchronous analog to digital convertor of claim 1, wherein the state machine comprises a dynamic logic stage with a non-complementary pull-up network and pull-down network connected to a same node, wherein each of the pull-up network and the pull-down network are operable to (i) enable multiple state transitions during the evaluation of the dynamic logic stage, and (ii) be controlled by asynchronous signals.

3. The asynchronous analog to digital convertor of claim 2, wherein the pull-up network and the pull-down network are operable to pre-charge the parasitic capacitance upon activation of the bit-slice.

4. The asynchronous analog to digital convertor of claim 1, wherein the successive approximation register is a dynamic register comprising a plurality of parasitic capacitors of the state machines.

5. The asynchronous analog to digital convertor of claim 4, further comprising:
   a regenerative register operable to store the state of the dynamic register after the comparison of the LSB slice is complete; and
   a standby controller for (i) placing the comparator, the digital to analog converter, and the control block in a standby mode after the transfer of the state of the dynamic register to the regenerative register, and (ii) placing the comparator, the digital to analog converter, and the control block in an active mode again at the beginning of the next external clock period.

6. The asynchronous analog to digital convertor of claim 1, wherein the digital to analog converter is a charge redistribution digital to analog converter comprising a switched capacitor array of binary weighted capacitors.

7. The asynchronous analog to digital convertor of claim 1, wherein the state machine of each bit-slice is partitioned as a main state machine with six transistors connected in two stages, and a digital to analog converter state machine with six transistors connected in a single stage, whereby each parasitic capacitor of each digital to analog converter state machine is a dynamic register bit.

8. An electronic device comprising an analog to digital convertor according to claim 1.

9. An asynchronous analog to digital convertor for converting an analog input signal into a digital output, the analog to digital convertor comprising:
   a clock input operable to receive an external clock signal having a clock period;
   a comparator operable to compare the analog input signal to a reference signal;
   a digital to analog converter operable to generate the reference signal; and
   a control block connected to the comparator and to the digital to analog converter, wherein the control block comprises a plurality of identical bit-slices connected in a chain and are arranged to be activated one after the other, wherein
      each bit-slice comprises (i) a state machine arranged to control the comparator to compare the analog input signal to the reference voltage, and to store the result of the comparison as a bit value in a successive approximation register, and (il) dynamic logic with parasitic capacitors controlled by asynchronous signals, wherein the dynamic logic is operable to store each state of the state machine.

10. The asynchronous analog to digital converter of claim 9, wherein the reference signal corresponds to a state of the successive approximation register.

11. The asynchronous analog to digital converter of claim 9, wherein the control block is operable to generate and receive a sequence of control signals according to a successive approximation algorithm.

12. The asynchronous analog to digital converter of claim 9, wherein the control block is operable to perform a plurality of comparisons, and to update the state of the successive approximation register thereby generating the digital output.

13. The asynchronous analog to digital converter of claim 9, wherein the chain comprises a most significant bit slice (MSB-slice) and a least significant bit-slice (LSB-slice) that are interconnected by a plurality of intermediate bit-slices, wherein the bit-slices are arranged to be activated one after the other.

14. The asynchronous analog to digital converter of claim 12, wherein the MSB-slice is arranged to be activated by the external clock signal, and the LSB-slice and intermediate bit-slices are arranged to be activated by a previous bit-slice.

15. The asynchronous analog to digital converter of claim 9, wherein each bit-slice is arranged to set the next bit of the successive approximation register and to activate the next bit-slice.

16. The asynchronous analog to digital convertor of claim 9, wherein the state machine comprises a dynamic logic stage with a non-complementary pull-up network and pull-down network connected to a same node, wherein each of the pull-up network and the pull-down network are operable to (i) enable multiple state transitions during the evaluation of the dynamic logic stage, and (ii) be controlled by asynchronous signals.

17. The asynchronous analog to digital convertor of claim 9, wherein the successive approximation register is a dynamic register comprising a plurality of parasitic capacitors of the state machines.

18. The asynchronous analog to digital convertor of claim 17, further comprising:
    a regenerative register operable to store the state of the dynamic register after the comparison of the LSB slice is complete; and
    a standby controller for (i) placing the comparator, the digital to analog converter, and the control block in a standby mode after the transfer of the state of the dynamic register to the regenerative register, and (ii) placing the comparator, the digital to analog converter, and the control block in an active mode again at the beginning of the next external clock period.

19. The asynchronous analog to digital convertor of claim 9, wherein the digital to analog converter is a charge redistribution digital to analog converter comprising a switched capacitor array of binary weighted capacitors.

20. The asynchronous analog to digital convertor of claim 9, wherein the state machine of each bit-slice is partitioned as a main state machine with six transistors connected in two stages, and a digital to analog converter state machine with six transistors connected in a single stage, whereby each parasitic capacitor of each digital to analog converter state machine is a dynamic register bit.

* * * * *